(12) United States Patent
Lee et al.

(10) Patent No.: US 8,879,320 B2
(45) Date of Patent: Nov. 4, 2014

(54) METHOD OF PROGRAMMING MULTI-LEVEL CELLS IN NON-VOLATILE MEMORY DEVICE

(75) Inventors: Chung-Hyun Lee, Suwon-si (KR); Ki-Hwan Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 8 days.

(21) Appl. No.: 13/611,598

(22) Filed: Sep. 12, 2012

(65) Prior Publication Data

US 2013/0135929 A1 May 30, 2013

(30) Foreign Application Priority Data

Nov. 30, 2011 (KR) ........................ 10-2011-0126886

(51) Int. Cl.
*G11C 11/34* (2006.01)

(52) U.S. Cl.
USPC ................................................... 365/185.03

(58) Field of Classification Search
USPC ................................................... 365/185.03
See application file for complete search history.

(56) References Cited

U.S. PATENT DOCUMENTS

| | | | |
|---|---|---|---|
| 2006/0002190 | A1 | 1/2006 | Roohparvar |
| 2008/0310226 | A1* | 12/2008 | Kang et al. ............... 365/185.03 |
| 2008/0316830 | A1 | 12/2008 | Yang et al. |
| 2009/0010063 | A1 | 1/2009 | Shiga |
| 2009/0154251 | A1 | 6/2009 | Jones et al. |
| 2010/0149868 | A1* | 6/2010 | Yoo et al. ................. 365/185.03 |
| 2010/0214844 | A1* | 8/2010 | Lee et al. ................. 365/185.18 |

FOREIGN PATENT DOCUMENTS

JP  2009-016021  1/2009

* cited by examiner

*Primary Examiner* — Anthan Tran
(74) *Attorney, Agent, or Firm* — Volentine & Whitt, PLLC

(57) ABSTRACT

A method of programming a multi-level cells (MLC) commonly coupled to a word line in a non-volatile memory device includes shadow-programming first MLC to a first shadow state, shadow-programming second MLC to a second shadow state less than the first shadow state, and then main-programming the first MLC from the first shadow state to a first final state and main-programming the second MLC from the second shadow state to the second final state less than the first final state.

15 Claims, 13 Drawing Sheets

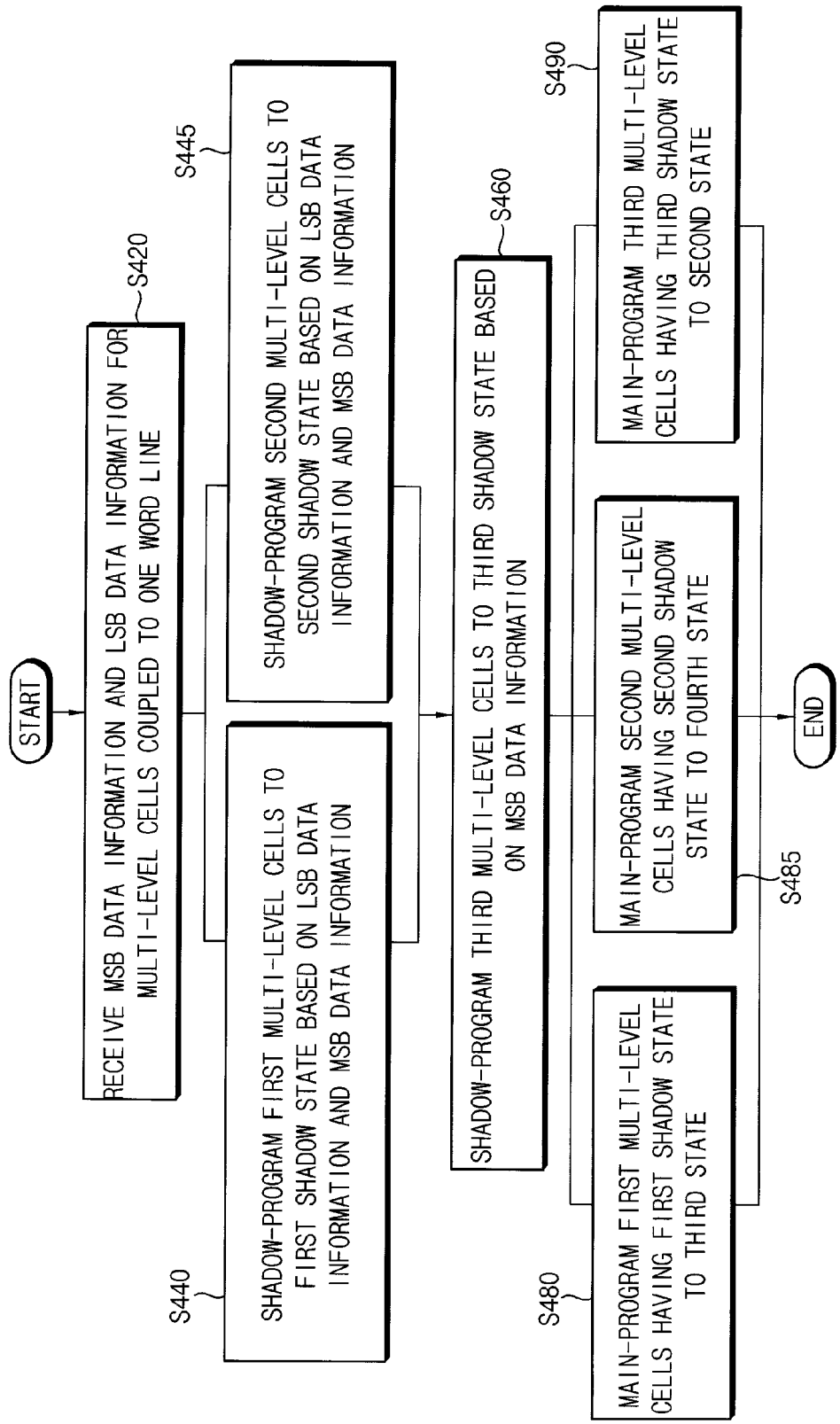

METHOD OF PROGRAMMING MULTI-LEVEL CELLS IN NON-VOLATILE MEMORY DEVICE

CROSS-REFERENCE TO RELATED APPLICATION(S)

This application claims priority under 35 USC §119 to Korean Patent Applications No. 10-2011-0126886 filed on Nov. 30, 2011, the subject matter of which is hereby incorporated by reference.

BACKGROUND

The inventive concept relates generally to semiconductor memory devices. More particularly, the inventive concept relates to methods of programming multi-level cells in non-volatile memory devices.

Semiconductor memory devices may be classified as volatile or non-volatile according to their operative nature. Volatile memory devices lose stored data in the absence of applied power, while non-volatile memory devices are able to retain stored data under such conditions. Contemporary trends in electronic devices demand lower power consumption and smaller overall device size. In response to these demands, NAND flash memory is a popular choice among other types of non-volatile memory, since NAND flash memory enjoys a relatively small size, high integration density, and low power consumption. This is particularly true for NAND flash memory incorporating multi-level memory cells (MLC) configured to store two or more data bits per memory cell.

However, as the integration density of NAND flash memory arrays including MLC has increased, various coupling effects during program operations begin to adversely influence adjacent MLC. Coupling may be classified as bit-line coupling occurring in a bit-line direction and word line coupling occurring in a word line direction. During conventional programming of MLC, word line coupling presents a greater problem than bit-line coupling.

In general, adverse coupling effects during programming of MLC may be understood in terms of an "aggressor cell" and one or more "victim cells". The aggressor cell is usually the MLC targeted by the program operation ("the target cell"). In contrast, the victim cells are MLC physically adjacent (or proximate) to the target cell during the program operation.

SUMMARY

Certain embodiments of the inventive concept provide methods of programming a plurality of multi-level cells (MLC) within a non-volatile memory device while reducing or preventing bit-line coupling and word line coupling between adjacent MLC.

According to one embodiment, the inventive concept provides a method of programming multi-level cells (MLC) in a non-volatile memory device. The programming method includes least significant bit (LSB) programming followed by most significant bit (MSB) programming. Each MLC is capable of being programmed to one of a first state defined by a first threshold voltage distribution, a second state defined by a second threshold voltage distribution greater than the first threshold voltage distribution, third state defined by a third threshold voltage distribution greater than the second threshold voltage distribution, and a fourth state defined by a fourth threshold voltage distribution greater than the third threshold voltage distribution. And the method comprises; receiving MSB data information and LSB data information for a plurality of MLC coupled to a current word line within the non-volatile memory, shadow-programming first MLC among the plurality of MLC to a first shadow state based on the LSB data information during LSB programming, wherein a final state following programming for each one of the first MLC is the third state or the fourth state, shadow-programming second MLC among the plurality of MLC to a second shadow state based on the MSB data information, wherein a final state following programming for each one of the second MLC is the second state, and then main-programming the first MLC from the first shadow state to either the third state or the fourth state and main-programming the second MLC from the second shadow state to the second state during MSB programming.

According to another embodiment, the inventive concept provides a method of programming multi-level cells (MLC) in a non-volatile memory device, the programming method including least significant bit (LSB) programming followed by most significant bit (MSB) programming, wherein each MLC is capable of being programmed to one of a first state defined by a first threshold voltage distribution, a second state defined by a second threshold voltage distribution greater than the first threshold voltage distribution, third state defined by a third threshold voltage distribution greater than the second threshold voltage distribution, and a fourth state defined by a fourth threshold voltage distribution greater than the third threshold voltage distribution, the method comprising; receiving MSB data information and LSB data information for a plurality of MLC coupled to a current word line in the non-volatile memory, during LSB programming and based on the LSB data information and MSB data information, shadow-programming first MLC among the plurality of MLC to a first shadow state, wherein a final state following programming for each one of the first MLC is the third state, and shadow-programming second MLC among the plurality of MLC to a second shadow state second, wherein a final state following programming for each of the second MLC is the fourth state, shadow-programming third MLC among the plurality of MLC to a third shadow state based on the MSB data information, wherein a final state following programming for each of the third MLC is the second state, and main-programming the first MLC from the first shadow state to the third state, main-programming the second MLC from the second shadow state to the fourth state, and main-programming the third MLC from the third shadow state to the second state during the MSB programming.

According to another embodiment, the inventive concept provides a method of programming a plurality of multi-level cells (MLC) commonly coupled to a word line in a non-volatile memory device, the method comprising; grouping the plurality of MLC into first MLC and second MLC according to a least significant bit (LSB) of program data to be respectively programmed to each one of the plurality of MLC, shadow-programming the first MLC to a first shadow state, shadow-programming the second MLC to a second shadow state less than the first shadow state, and then main-programming the first MLC from the first shadow state to a first final state and main-programming the second MLC from the second shadow state to the second final state less than the first final state.

BRIEF DESCRIPTION OF THE DRAWINGS

Illustrative, non-limiting example embodiments will be more clearly understood from the following detailed description taken in conjunction with the accompanying drawings.

FIG. 7 is a flow chart illustrating a method of programming a plurality of multi-level cells for a non-volatile memory device according to example embodiments.

DETAILED DESCRIPTION

Certain embodiments of the inventive concept will now be described in some additional detail with reference to the accompanying drawings. The present inventive concept may, however, be embodied in many different forms and should not be construed as being limited to only the illustrated embodiments. Rather, the illustrated embodiments are provided so that this disclosure will be thorough and complete, and will fully convey the scope of the inventive concept to those skilled in the art. Throughout the written description and drawings, like reference numbers and labels refer to like or similar elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, s, operations, elements, and/or components, but do not preclude the presence or addition of one or more other features, integers, s, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
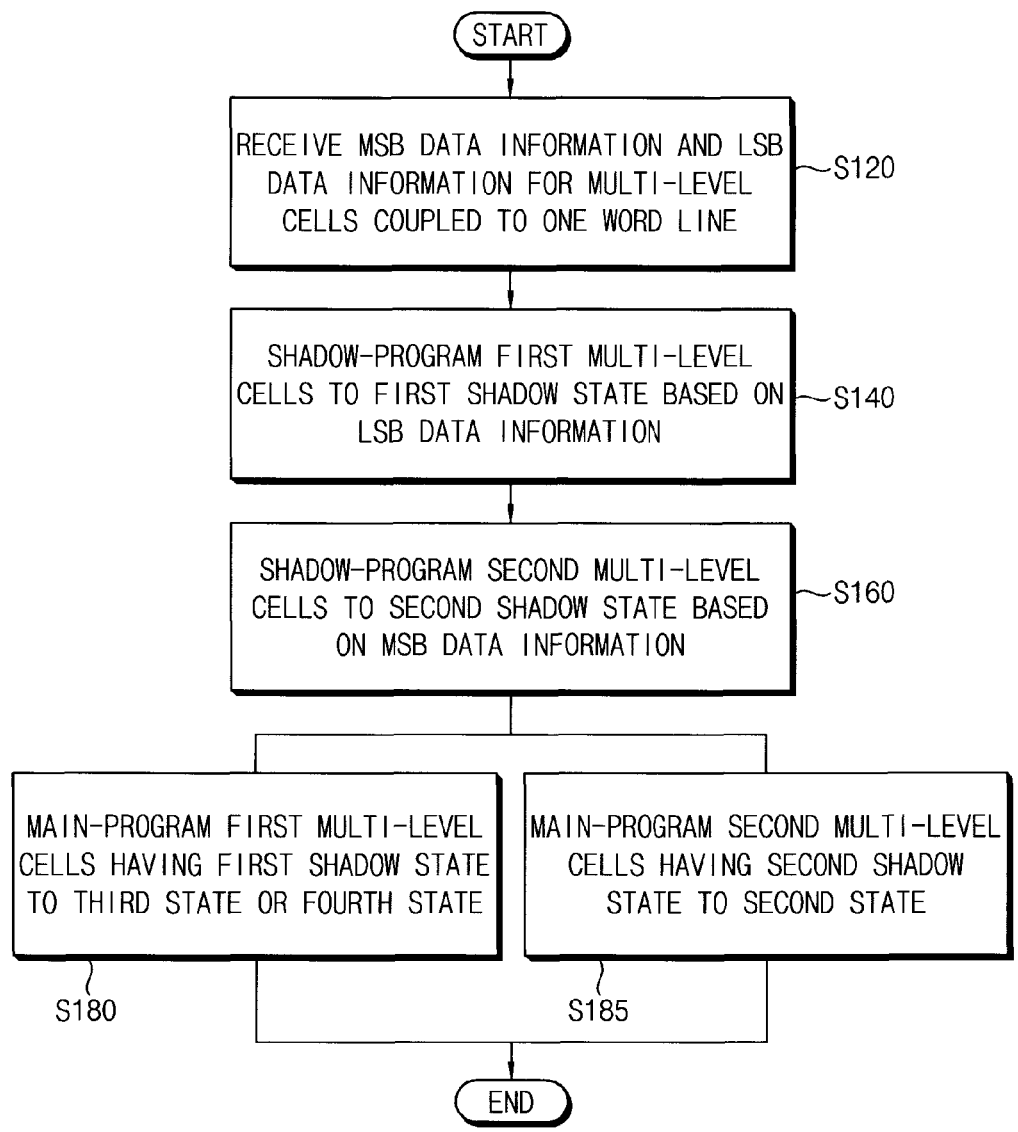
FIG. 1 is a flow chart illustrating a method of programming a plurality of multi-level cells for a non-volatile memory device according to example embodiments.

FIG. 1 is a flow chart summarizing a method of programming a plurality of multi-level cells (MLC) for a non-volatile memory device according to embodiment of the inventive concept. The example method illustrated in FIG. 1 assumes a NAND flash memory device including an array of 2-bit MLC subject to programming in one of four final states; namely a first state, second state, third state and fourth state.

Referring to FIG. 1, the method begins by receiving information related to most significant bit (MSB) data and information related to least significant bit (LSB) data for a plurality of MLC commonly coupled to a word line (S120). Then, a first set of MLC (hereafter, "first MLC") are shadow-programmed to a first shadow state based on the LSB data information during a LSB program phase of the ongoing program operation (S140). Of note, the first MLC are MLC that will ultimately be programmed at conclusion of the program operation to a final state of either the third state or the fourth state. A second set of MLC (hereafter, "second MLC") are shadow-programmed to a second shadow state based on the MSB data information (S160). The second MLC will ultimately be programmed to a final state of the second state. Here, it should be noted that the order in which the first MLC and the second MLC are shadow-programmed during LSB programming is a matter of design choice.

Following shadow-programming, main-programming may be applied during a MSB phase of the program operation to both the first MLC (S180) and the second MLC (S185). Under the working assumptions associated with FIG. 1., MLC are programmed in a NAND flash memory device by applying a ground voltage to bit-lines coupled to selected cells, while a program prohibition voltage is applied to bit-lines coupled to non-selected cells, and a power voltage turning-ON string selection transistors is applied to a string selection line. In addition, a program voltage is applied to a word line coupled to the selected cells, and a pass voltage is applied to word lines coupled to the non-selected cells. Thus, the channels of non-selected cells are boosted to a voltage equal to the power voltage less a threshold voltage of the string selection transistor. As a result, the string selection transistors coupled to the non-selected cells are turned OFF. As a result, the selected cells are programmed by Fowler-Nordheim (F-N) tunneling between the floating gates and respective channels. In contrast, the non-selected cells are not programmed because the boosted channels of the non-selected cells prevent the F-N tunneling between floating gates and the boosted channels. In this manner, MLC commonly coupled to a word line may be simultaneously programmed in a NAND flash memory device.

In should also be noted that while the working example of FIG. 1 is directed to 2-bit MLC in a NAND flash memory device, other types of MLC may be used, including 3-bit MLC (having 8 possible final states) or a greater.

As mentioned above, the method of FIG. 1 may begin (S120) with receipt of MSB data information and LSB data information for a plurality of MLC commonly coupled to a word line. The MSB data information may be included in a program command associated with the MSB programming (i.e., a MSB program command), and the LSB data information may be included in a program command associated with the LSB programming (i.e., a LSB program command). LSB programming and MSB programming will be sequentially executed for the MLC. Consistent with the example of FIG. 1, certain embodiments of the inventive concept may correlate the first state (or erase state) with a data value of "00", the second state (a first programmed state) with a data value of "10", the third state (a second programmed state) with a data value of "01", and the fourth state (a third programmed state) with a data value of "11". However, other final state to corresponding data value assignments are certainly possible, as will be appreciated by those skilled in the art.

Next, the method of FIG. 1 may shadow-program the first MLC to have the first shadow state based on the LSB data information during the LSB program phase of the MLC program operation (S140). Generally, a plurality of MLC commonly coupled to a word line may be divided (or grouped) according to the intended program value of their LSB (i.e., '0' and '1'). It is this LSB that is defined during the LSB program phase. Thus, when LSB programming is performed, the LSB data information for the word line is referenced. As described above, the third state may correspond to a data value of "01", and the fourth state may correspond to a data value of "11". In this case, the LSB of the first MLC is '1'. In addition, the first state may correspond to a data value of "00", and the second state may correspond to a data value of "10". In this case, the LSB of the second MLC is '0'. Hence, the first MLC and second MLC may be distinguished by their respective LSB (i.e., '0' and '1') (S140).

In certain embodiments of the inventive concept, the first shadow state may be defined by a verification voltage that is less than a defined threshold voltage range for the third state but greater than a defined range for the second state. That is, the first shadow state may be defined between the second state and third state.

As will be appreciated from the foregoing, the method of FIG. 1 will not directly program the first MLC their respective final state (i.e., the third state or the fourth state). Rather, the method of FIG. 1 uses the main-programming of the first MLC (following the shadow-programming) to place the first MLC in one of the final states. Thus, during the constituent program operation the threshold voltage of each one of the first MLC is moved from the first shadow state to its final state by the main-programming.

As a result, in one embodiment, the first MLC commonly coupled to "a current word line" (i.e., a word line to which a current programming operation is directed) may be shadow-programmed to the first shadow state after MSB programming has been performed on a previous word line that is non-adjacent to the current word line. In another embodiment, after the first MLC are shadow-programmed to the first shadow state, MSB programming may be performed on a previous word line that is non-adjacent to the current word line.

As noted above, the method of FIG. 1 may shadow-program the second MLC to the second shadow state based on the MSB data information (S160) before programming the second MLC to a final state (e.g., the second state) (S185). A plurality of MLC commonly coupled to a word line may also be divided (or grouped) according to their intended MSB (i.e., '0' and '1') during MSB programming. Thus, when MSB programming is performed, the MSB data information is referenced. However, since the method of FIG. 1 needs to shadow-program the second multi-level cells to the second shadow state, the MSB data information is also required at this phase (S160).

In certain embodiments of the inventive concept, the second shadow state may be defined between the second state and the first state. As before, it should be noted that the method of FIG. 1 will not directly program the second MLC to the final state (i.e., the second state). Rather, the method of FIG. 1 will main-program the second MLC to the final state (i.e., the second state) only after shadow-programming the second MLC to the second shadow state.

In certain embodiments of the inventive concept, the shadow-programming and/or the main-programming of MLC may be accomplished using an incremental pulse programming (ISPP) techniques. Such techniques are well understood by those skilled in the art. But generally during an ISSP, the threshold voltage of each MLC is determined according to process conditions such as a channel width, a channel length, an oxide thickness, etc. Thus, although a plurality of MLC are arranged in a single memory cell array, the speed at which each MLC may be changed under similar programming conditions will vary. Therefore, methods consistent with the inventive concept may employ ISPP rather than shot pulse programming techniques in order to better narrow threshold voltage distributions for the programmed MLC. According to ISPP, the programmed states of the MLC may be verified using one or more verification voltage(s) following application of a program voltage to the MLC. Once programming of a particular MLC is complete, a program prohibit voltage may be applied. On the other hand, incremental programming of the MLC may be repeated with an increased program voltage until an appropriate threshold voltage is obtained. Each iteration of increased program voltage, apply program voltage, verify resulting threshold voltage may be seen as a program loop, wherein program loos are performed until each MLC is correctly programmed.

Once both the first MLC and second MLC have been shadow-programmed, main-programming of the first MLC (S180) and main-programming of the second MLC (S185), collectively based on the MSB data information may be performed. Those skilled in the art will recognize that assignment of main-programming to various final states and/or the sequence or simultaneous main-programming of various MLC is a matter of design choice.

The method of FIG. 1 may be implemented using a sequence of program commands provided within a computational system, a digital logic system, and/or the control logic of a host device. The program commands may be recorded on computer-readable recoding media, such as magnetic recording media (e.g., a hard-disk, a floppy-disk, a magnetic-tape, etc.), optical recording media (e.g., a CD-ROM, DVD, etc.), or optical/magnetic recording media (e.g., a floptical disk, etc.).

As described above, when performing LSB programming and MSB programming on a plurality of MLC, certain embodiments of the inventive concept may main-program the plurality of MLC to respective final state(s) after shadow-programming selected groups of the plurality of MLC to one or more shadow state(s) based on MSB data information and/or LSB data information. Hence, either one or both of bit-line coupling and word line coupling between adjacent (or proximate) MLC may be reduced or prevented.

To review, during conventional programming, when an aggressor cell adjacent to a victim cell is programmed, the threshold voltage of the victim cell may be adversely influenced by the programming of the aggressor cell. And the probability of this adverse influence rises with the magnitude of the threshold voltage change for the aggressor cell. In contrast, methods consistent with the inventive concept effectively reduce or prevent adverse influencing of victim cells, particularly word line coupling, by reducing the magnitude of the change in the threshold voltage of an aggressor cell during MSB programming.

FIG. 2, collectively FIGS. 2A through 2E, conceptually illustrates the method of FIG. 1.

Referring to FIGS. 2A through 2E, a plurality of MLC commonly coupled to a word line may be selectively programmed to one of a first state P1, a second state P2, a third state P3, and a fourth state P4. The first state P1, second state P2, third state P3, and fourth state P4 are assumed to correlate to data values of "00", "10", "01", and "11", respectively. The first through fourth states (P1 through P4) of FIG. 2 indicate respective threshold voltage distributions for the MLC in relation to verification voltages (VM1, VM2 and VM3).

Figure 2A:
FIGS. 2A through 2E are diagrams illustrating a method of FIG. 1.

FIG. 2A assumes that target MLC are initially programmed to the first state P1 (i.e., an erase state).

Figure 2B:
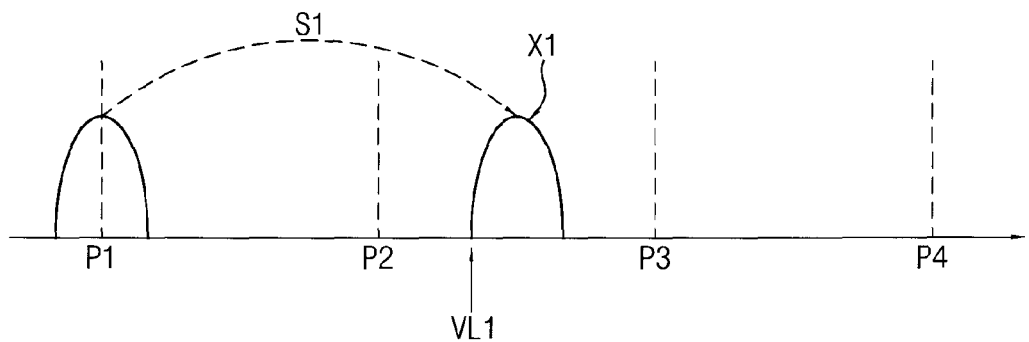

FIG. 2B shows the first MLC (i.e., a MLC that will ultimately be programmed to one of the third state P3 or the fourth state P4) being shadow-programmed (i.e., indicated by the arrow S1) to the first shadow state X1 based on LSB data information during a LSB program. As shown in FIG. 2B, the first shadow state X1 is disposed between the second state P2 and the third state P3, and each first MLC programmed to the first shadow state X1 will have a threshold voltage greater than a first verification voltage VL1.

In one embodiment, the shadow-programming S1 is performed using an ISPP technique. In another embodiment, the shadow-programming S1 is performed using a one-shot pulse programming technique. As described above, ISPP may well be preferred over one-shot techniques in embodiments of the inventive concept because ISPP better narrows the final threshold voltage distributions for the MLC as compared with one shot pulse programming techniques. Thus, the method of FIG. 1 may program the first MLC by iteratively applying an increasing program voltage to the first MLC during the program operation each program voltage iteration being followed by a verification. In the illustrated example of FIG. 2B, the programmed state for the first MLC may be verified using a first verification voltage VL1.

Figure 2C:
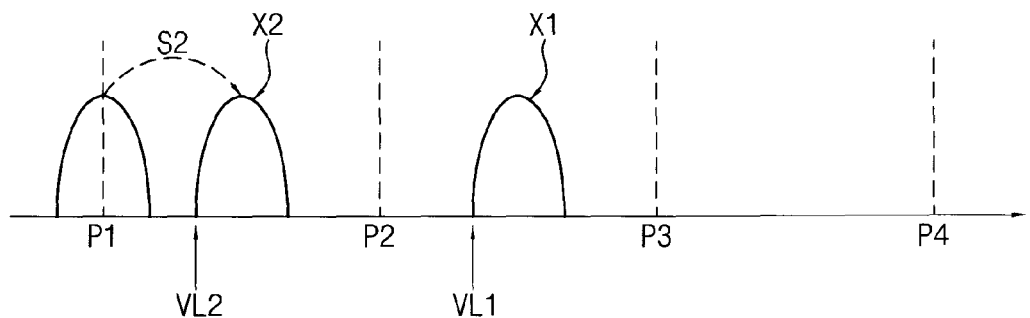

FIG. 2C shows that second MLC being shadow-programmed (i.e., indicated by the arrow S2) to the second shadow state X2 based on MSB data information. As illustrated in FIG. 2C, the second shadow state X2 may be disposed between the first state P1 and the second state P2, and each second MLC programmed to the second shadow state X2 will have a threshold voltage greater than a second verification voltage VL2. Here, the second verification voltage VL2 is less than the first verification voltage VL1.

Here again, in certain embodiments, the shadow-program S2 may be performed using ISPP or one-shot pulse program techniques. When ISPP is used, the programming of the second MLC will result in each one of the second MLC having a threshold voltage greater than the second verification voltage VL2.

Figure 2D:
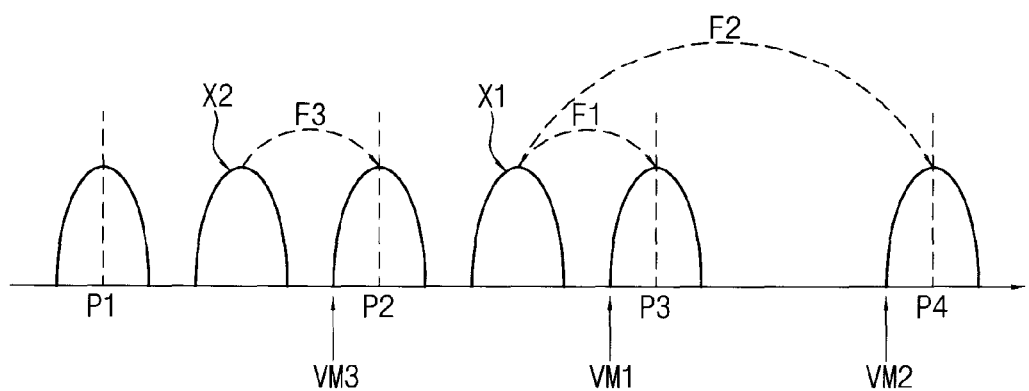

FIG. 2D shows the first MLC previously programmed to the first shadow state X1 being main-programmed (i.e., indicated by arrows F1 and F2) to have a final state (i.e., the third state P3 or the fourth state P4), and second MLC previously programmed to the second shadow state X2 being main-programmed (i.e., indicated by arrow F3) to have a final state (i.e., the second state P2) based on MSB data information during MSB programming.

Either ISSP or one-shot programming techniques may be used here.

Thus, the method of FIG. 1 may program the first MLC which will have a final state of the third state P3 by applying a program voltage every program loop, may verify states (i.e., program states) by comparing threshold voltages of the first multi-level cells with a first final verification voltage VM1, and then may repeat a programming operation by applying the program voltage increased by a predetermined for the first multi-level cells of which threshold voltages are lower than the first final verification voltage VM1. Here, a programming operation may be finished for the first MLC of which threshold voltages are greater than the first final verification voltage VM1. In addition, the method of FIG. 1 may program the first MLC which will have a final state of the fourth state P4 by applying a program voltage every program loop, may verify states (i.e., program states) by comparing threshold voltages of the first multi-level cells with a second final verification voltage VM2, and then may repeat a programming operation by applying the program voltage increased by a predetermined for the first multi-level cells of which threshold voltages are less than the second final verification voltage VM2. Here, a programming operation may be finished for the first MLC having threshold voltages greater than the second final verification voltage VM2.

Further, the method of FIG. 1 may program the second MLC which will have a final state of the second state P2 by applying a program voltage every program loop, may verify states (i.e., program states) by comparing threshold voltages of the second multi-level cells with a third final verification voltage VM3, and then may repeat a programming operation by applying the program voltage increased by a predetermined for the second multi-level cells of which threshold voltage are lower than the third final verification voltage VM3. Here, a programming operation may be finished for the second MLC having threshold voltages greater than the third final verification voltage VM3.

Figure 2E:
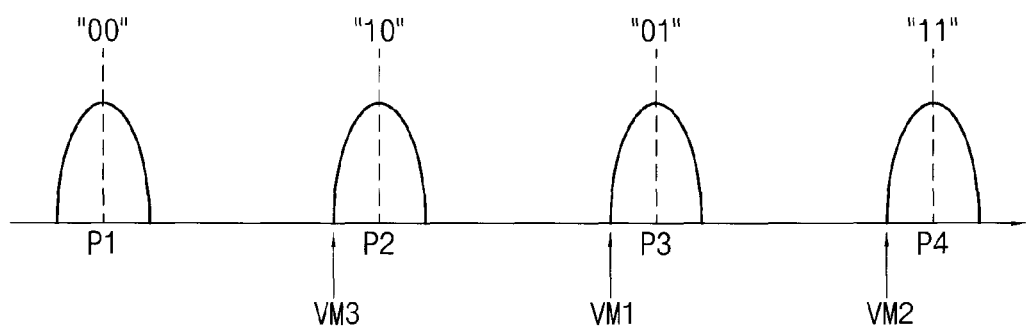

FIG. 2E shows that a plurality of MLC coupled to a word line as finally programmed by the method of FIG. 1. That is, each MLC may be programmed to one state selected from among the first state P1, second state P2, third state P3, and fourth state P4. As illustrated in FIG. 2E, each MLC having the third state P3 has a threshold voltage greater than the first final verification voltage VM1, each MLC having the fourth state P4 will have a threshold voltage greater than the second final verification voltage VM2, and each MLC having the second state P2 will have a threshold voltage greater than the third final verification voltage VM3. Thus, a non-volatile memory device (e.g., a NAND flash memory device) may detect MLC programmed to the data value of "00" by reading the first state P1 (i.e., an erase state), MLC programmed to that data value of "10" by reading the second state P2, MLC programmed to the data value of "01" by reading the third state P3, and MLC programmed to the data value of "11" by reading the fourth state P4.

Further, the method of FIG. 1 may efficiently reduce a coupling (e.g., bit-line coupling and word line coupling) between adjacent MLC during LSB programming and MSB programming by first shadow programming the MLC and then main-programming the MLC.

Figure 3:
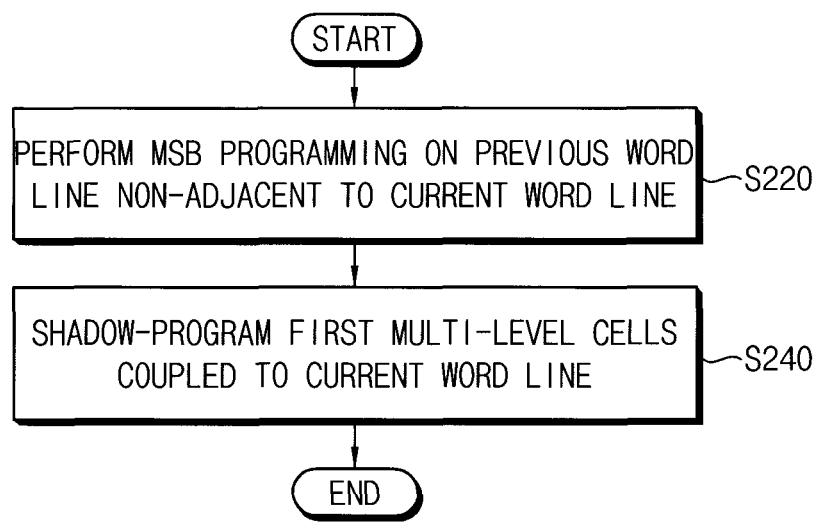
FIG. 3 is a flow chart illustrating an example in which multi-level cells are programmed by a method of FIG. 1.
Figure 4:
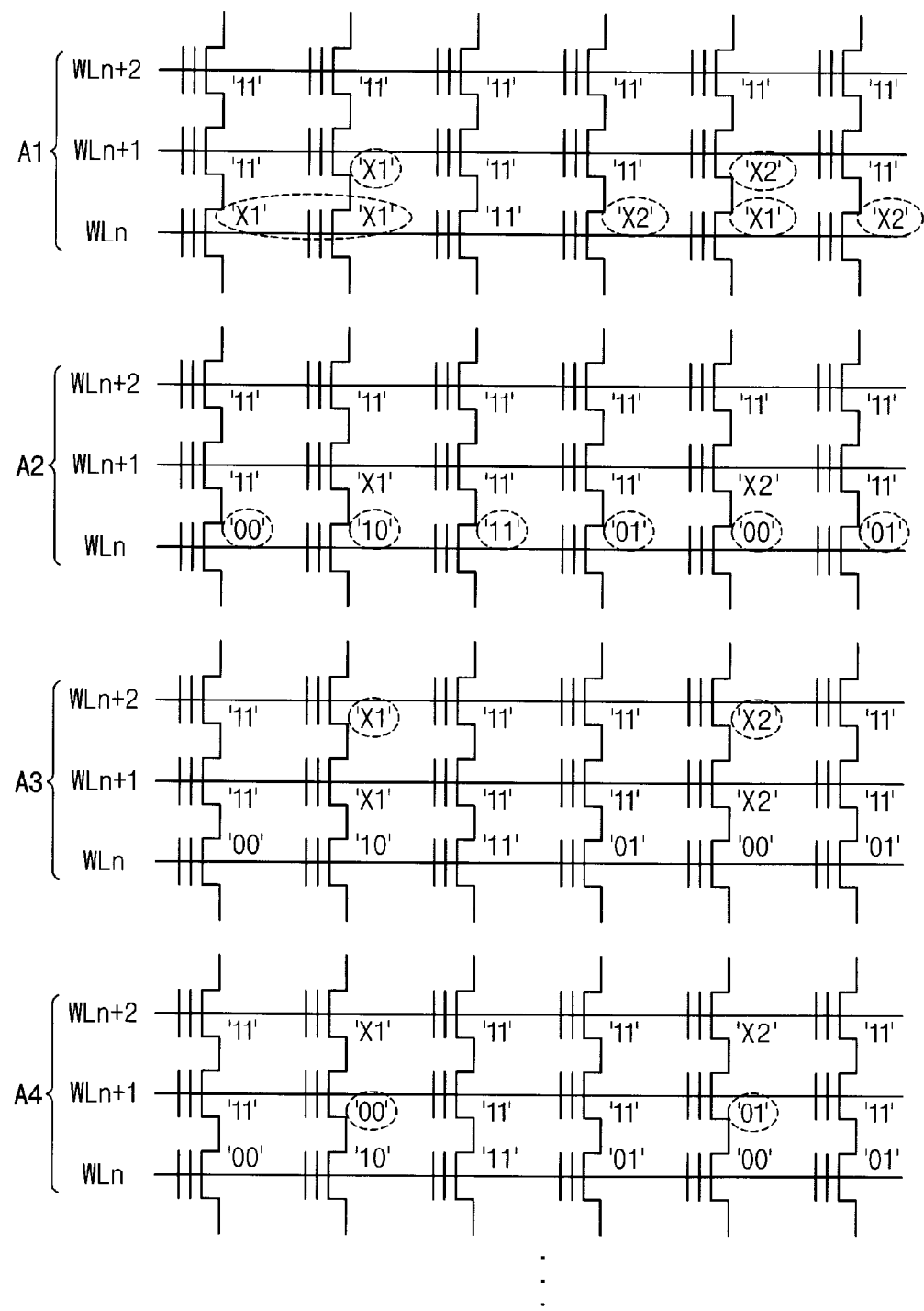
FIG. 4 is a diagram illustrating an example in which multi-level cells are programmed by a method of FIG. 1.

FIG. 3 is a flow chart further describing one approach to the programming of MLC described above with reference to FIG. 1. FIG. 4 is a partial diagram of a memory cell array including MLC being programmed by the method of FIG. 1.

Referring to FIGS. 1 through 4, the first MLC are shadow-programmed as described above (S240). However, prior to this MSB programming of MLC commonly coupled to a previous word line non-adjacent to the current word line is performed (S220). Here, the first state P1, the second state P2, the third state P3, and the fourth state P4 respectively correspond to data values "11", "01", "10", and "00. As illustrated in FIG. 4, assuming respective grouping of word lines including a (n)th word line WLn, (n+1)th word line WLn+1, and (n+2)th word line WLn+2, where n is positive integer greater than or equal to 1, said grouping are sequentially arranged in a memory cell array. On the basis of these word line groupings, a programming operation for each of the (n) th word line WLn, the (n+1)th word line WLn+1, and the (n+2)th word line WLn+2 may be sequentially performed in an established order. For convenience of descriptions, the programming operation is illustrated according to a first timing point A1 through a fourth timing point A4 in FIG. 4. That is, the method of FIG. 1 may performed according to a sequentially applied programming operation with reference to the first timing point A1 through the fourth timing point A4.

As shown by the first timing point A1, the method of FIG. 1 may shadow-program the first MLC to the first shadow state X1 based on the LSB data information for the (n) th word line WLn during LSB programming of the (n) th word line WLn. Then, the method of FIG. 1 may shadow-program the second MLC to the second shadow state X2 based on the MSB data information for the (n) th word line WLn. As a result, each MLC coupled to an (n) th word line WLn will have been programmed to one of the erase state 11, the first shadow state X1, and the second shadow state X2.

Then, the method of FIG. 1 may shadow-program the first MLC to the first shadow state X1 based on the LSB data information for the (n+1)th word line WLn+1 during LSB programming of the (n+1)th word line WLn+1. Then, the method of FIG. 1 may shadow-program the second MLC to the second shadow state X2 based on the MSB data information for the (n+1)th word line WLn+1. As a result, each MLC coupled to the (n+1)th word line WLn+1 will be programmed to one of the erase state 11, the first shadow state X1, and the second shadow state X2.

Next, the method of FIG. 1 may finish programming of the (n) th word line WLn by performing MSB programming on the (n) th word line WLn. That is, as shown by the second timing point A2, the method of FIG. 1 may main-program the first MLC and the second MLC to a final state for the (n) th word line WLn. In one embodiment, when MSB programming is performed on the (previous) (n) th word line WLn, the method of FIG. 1 may main-program the second MLC having been programmed to the second shadow state X2 to have a final state (i.e., the second state P2) after main-programming the first MLC having the first shadow state X1 to have a final state (i.e., the third state P3 or the fourth state P4).

In another embodiment, when a MSB program is performed on the (n) th word line WLn, the method of FIG. 1 may main-program the first MLC having the first shadow state X1 to have a final state (i.e., the third state P3 or the fourth state P4) after main-programming the second multi-level cells having the second shadow state X2 to have a final state (i.e., the second state P2). As a result, each MLC coupled to the (n) th word line WLn may have one state of the first state P1 corresponding to the data value "11", the second state P2 corresponding to the data value "01", the third state P3 corresponding to the data value "10", and the fourth state P4 corresponding to the data value "00".

As shown by the third timing point A3, the method of FIG. 1 may shadow-program the first MLC to the first shadow state X1 based on the LSB data information for the (n+2)th word line WLn+2, and then shadow-program the second MLC to the second shadow state X2 based on the MSB data information the (n+2)th word line WLn+2. In other words, at the third timing point A3, the method of FIG. 1 may not perform MSB programming on the (n+1)th word line WLn+1. As a result, each MLC coupled to the (n+2)th word line WLn+2 may have one state of the erase state 11, the first shadow state X1, and the second shadow state X2. As described above, the method of FIG. 1 may shadow-program the first MLC coupled to a current word line (e.g., the (n+2)th word line WLn+2) after performing MSB programming on a previous word line (i.e., the (n) th word line WLn) that is non-adjacent to the current word line (e.g., the (n+2)th word line WLn+2).

Next, as shown by the fourth timing point A4, the method of FIG. 1 may finish programming the MLC of the (n+1)th word line WLn+1 by performing MSB programming on the (n+1)th word line WLn+1. That is, the method of FIG. 1 may main-program the first MLC having been programmed to the first shadow state X1 to a final state and main-program the second MLC having been programmed to the second shadow state X2 to a final state for the (n+1)th word line WLn+1. In one example embodiment, when a MSB program is performed on the (n+1)th word line WLn+1, the method of FIG. 1 may main-program the second multi-level cells having the second shadow state X2 to have a final state (i.e., the second state P2) after main-programming the first multi-level cells having the first shadow state X1 to have a final state (i.e., the third state P3 or the fourth state P4).

In another embodiment, when MSB programming is performed on the (n+1)th word line WLn+1, the method of FIG. 1 may main-program the first MLC having the first shadow state X1 to a final state (i.e., the third state P3 or the fourth state P4) after main-programming the second MLC having the second shadow state X2 to a final state (i.e., the second state P2). As a result, each MLC coupled to the (n+1)th word line WLn+1 may have one state of the first state P1 corresponding to the data value "11", the second state P2 corresponding to the data value "01", the third state P3 corresponding to the data value "10", and the fourth state P4 corresponding to the data value "00".

In this order, the method of FIG. 1 may complete the program operation for word lines of the memory cell array. As described above, the method of FIG. 1 may efficiently prevent a word line coupling by shadow-programming first MLC coupled to a current word line after performing MSB programming on a previous word line non-adjacent to the current word line.

Figure 5:
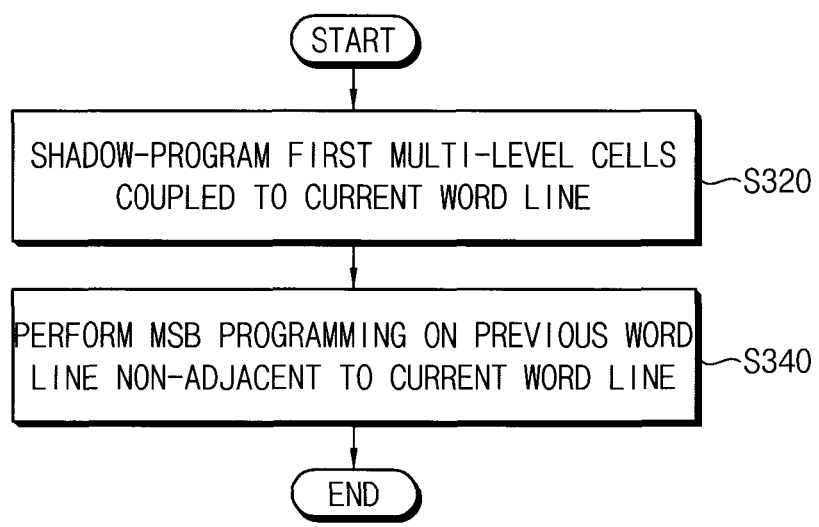
FIG. 5 is a flow chart illustrating another example in which multi-level cells are programmed by a method of FIG. 1.
Figure 6:
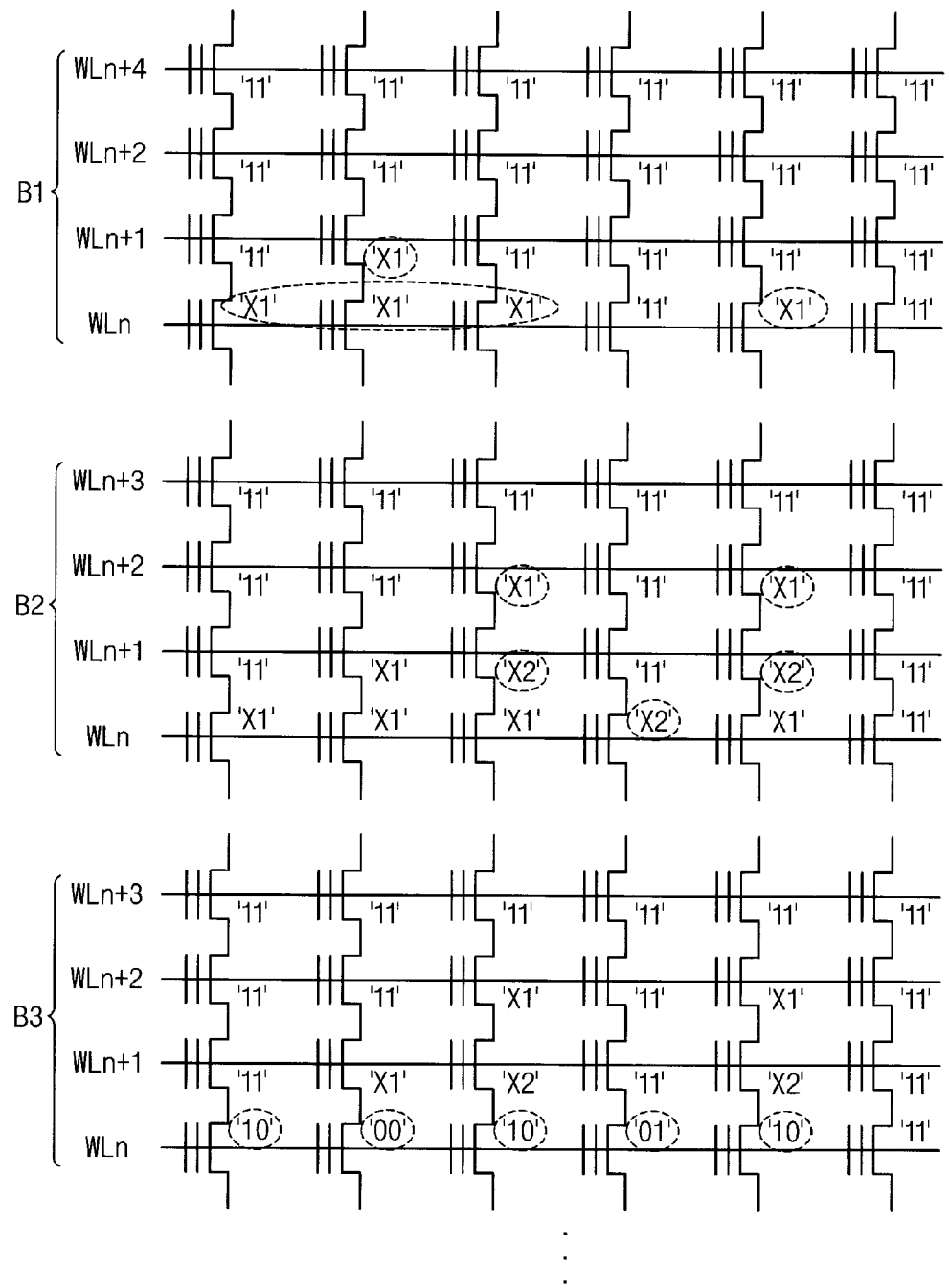
FIG. 6 is a diagram illustrating another example in which multi-level cells are programmed by a method of FIG. 1.

FIG. 5 is a flow chart illustrating another example in which MLC are programmed by the method of FIG. 1. FIG. 6 is a partial diagram of a memory cell array including MLC being programmed by the method of FIG. 1.

Referring to FIGS. 5 and 6, the method of FIG. 1 may shadow-program first MLC coupled to a current word line (S320), a final state of the first multi-level cells being the third state P3 or the fourth state P4, and then perform MSB programming on a previous word line non-adjacent to the current word line (S340). Here, the first state P1, the second state P2, the third state P3, and the fourth state P4 may correspond to a data value "11", a data value "01", a data value "10", and a data value "00", respectively. As illustrated in FIG. 6, assuming that (n) th word line WLn, (n+1)th word line WLn+1, (n+2)th word line WLn+2, and (n+3)th word line WLn+3, where n is an integer greater than or equal to 1, are sequentially arranged in one memory cell array, a programming operation for the (n) th word line WLn, the (n+1)th word line WLn+1, the (n+2)th word line WLn+2, and the (n+3)th word line WLn+3 may be sequentially finished in the order named. For convenience of descriptions, a programming result up to a first timing point B1 through a third timing point B3 is separately illustrated in FIG. 6. That is, the method of FIG. 1 may sequentially finish a programming operation according to the first timing point B1 through the third timing point B3.

As shown by the first timing point B1, the method of FIG. 1 may shadow-program the first MLC to have the first shadow state X1, where a final state of the first multi-level cells is the third state P3 or the fourth state P4, based on the LSB data information for the (n) th word line WLn when a LSB program is performed on the (n) th word line WLn. Then, the method of FIG. 1 may perform a LSB program on the (n+1)th word line WLn+1 before shadow-programming the second MLC to have the second shadow state X2, where a final state of the second MLC is the second state P2, based on the MSB data information for the (n) th word line WLn. That is, the method of FIG. 1 may shadow-program the first MLC to have the first shadow state X1, where a final state of the first MLC is the third state P3 or the fourth state P4, based on the LSB data information for the (n+1)th word line WLn+1. As a result, each multi-level cell coupled to the (n) th word line WLn may have one state of the erase state 11 and the first shadow state X1. Likewise, each multi-level cell coupled to the (n+1)th word line WLn+1 may have one state of the erase state 11 and the first shadow state X1.

As shown by the second timing point B2, the method of FIG. 1 may shadow-program the second MLC to have the second shadow state X2, a final state of the second MLC is the second state P2, based on the MSB data information for the (n) th word line WLn, and then may shadow-program the second MLC to have the second shadow state X2, a final state of the second MLC is the second state P2, based on the MSB data information for the (n+1)th word line WLn+1. As a result, each multi-level cell coupled to the (n) th word line WLn may have one state of the erase state 11, the first shadow state X1, and the second shadow state X2. Likewise, each multi-level cell coupled to the (n+1)th word line WLn+1 may have one state of the erase state 11, the first shadow state X1, and the second shadow state X2. Next, the method of FIG. 1 may shadow-program the first MLC to have the first shadow state X1, where a final state of the first MLC is the third state P3 or the fourth state P4, based on the LSB data information for the (n+2)th word line WLn+2. In other words, at the second timing point B2, the method of FIG. 1 may not perform a MSB program on the (n) th word line WLn. As a result, each multi-level cell coupled to the (n+2)th word line WLn+2 may have one state of the erase state 11 and the first shadow state X1.

Next, as shown by the third timing point B3, the method of FIG. 1 may finish a program operation for the (n) th word line WLn by performing a MSB program on the (n) th word line WLn. That is, the method of FIG. 1 may main-program the first MLC having the first shadow state X1 to have a final state (i.e., the third state P3 or the fourth state P4), and may main-program the second MLC having the second shadow state X2 to have a final state (i.e., the second state P2) for the (n) th word line WLn. In one example embodiment, when a MSB program is performed on the (n) th word line WLn, the method of FIG. 1 may main-program the second MLC having the second shadow state X2 to have a final state (i.e., the second state P2) after main-programming the first MLC having the first shadow state X1 to have a final state (i.e., the third state P3 or the fourth state P4). In another example embodiment, when a MSB program is performed on the (n) th word line WLn, the method of FIG. 1 may main-program the first MLC having the first shadow state X1 to have a final state (i.e., the third state P3 or the fourth state P4) after main-programming the second MLC having the second shadow state X2 to have a final state (i.e., the second state P2). As a result, each multi-level cell coupled to the (n) th word line WLn may have one state of the first state P1 corresponding to a data value "11", the second state P2 corresponding to a data value "01", the third state P3 corresponding to a data value "10", and the fourth state P4 corresponding to a data value "00". As described above, the method of FIG. 1 may shadow-program the first MLC coupled to one word line (e.g., the (n+2)th word line WLn+2), and then may perform a MSB program on a previous word line (i.e., the (n) th word line WLn) that is not adjacent to the word line (e.g., the (n+2)th word line WLn+2).

In this order, the method of FIG. 1 may finish a programming operation for word lines of the memory cell array. For instance, although not illustrated in FIG. 6, the method of FIG. 1 may perform a MSB program on the (n) th word line WLn, and then may shadow-program the second MLC to have the second shadow state X2 based on the MSB data information for the (n+2)th word line WLn+2. In other words, after a MSB program is performed on the (n) th word line WLn, the method of FIG. 1 may not perform a MSB program on the (n+1)th word line WLn+1. Next, the method of FIG. 1 may shadow-program the first MLC to have the first shadow state X1 for the (n+3)th word line WLn+3 by performing a LSB program on the (n+3)th word line WLn+3, and then may perform a MSB program on the (n+1)th word line WLn+1. Therefore, the method of FIG. 1 may efficiently reduce or prevent word line coupling among the word lines by shadow-programming first MLC coupled to a current word line and then MSB programming MLC coupled to a previous word line non-adjacent to the current word line.

FIG. 7 is a flow chart summarizing a method of programming a plurality of MLC for a non-volatile memory device according to an embodiment of the inventive concept.

Referring to FIG. 7, the method begins by receiving MSB data information and LSB data information for a plurality of MLC coupled to a word line (S420). Then, shadow-programming of first MLC to a first shadow state based on the LSB data information and the MSB data information is performed during LSB programming, wherein the intended final state for the first MLC is a third state (S440). Also, shadow-programming of second MLC to a second shadow state based on the LSB data information and MSB data information is performed during LSB programming, where a intended final state for the second MLC is a fourth state (S445). Then, shadow-program of third MLC to a third shadow state based on the MSB data information is performed, where the intended final state of the third MLC is a second state (S460).

The method of FIG. 7 then main-programs the first MLC to the third state during MSB programming (S480), main-programs the second MLC to the fourth state during the MSB programming (S485), and main-programs the third MLC to the second state during the MSB programming (S490). Here again for convenience of description, it is assumed that each MLC stores 2-bit data.

The method of FIG. 7 may receive the MSB data information and the LSB data information for a plurality of MLC coupled to a word line (S420). Here, the MSB data information may be included in a program command for programming the MSB data (i.e., a MSB program command), and the LSB data information may be included in a program command for programming the LSB (i.e., a LSB program command). According to the method of FIG. 7, a LSB program and a MSB program are sequentially performed on each multi-level cell. In addition, each multi-level cell may be programmed to have one state among the first through fourth states, and the first through fourth states may correspond to different data values. In detail, the first state may correspond to a data value "00", the second state may correspond to a data value "10", the third state may correspond to a data value "01", and the fourth state may correspond to a data value "11". Namely, the first state may correspond to an erase state, and the fourth state may have the highest verification voltage. Here, data values related to the first through fourth states may be variously determined according to required conditions. For example, the first state may correspond to a data value "11", the second state may correspond to a data value "01", the third state may correspond to a data value "10", and the fourth state may correspond to a data value "00".

Next, when a LSB program is performed, the method of FIG. 7 may shadow-program the first MLC to have the first shadow state based on the LSB data information and the MSB data information (S440), and may shadow-program the second MLC to have the second shadow state based on the LSB data information and the MSB data information (S445). As described above, a final state of the first MLC is the third state (i.e., the first MLC are going to be finally programmed to have the third state), and a final state of the second MLC is the fourth state (i.e., the second MLC are going to be finally programmed to have the fourth state). Generally, a plurality of MLC coupled to one word line may be divided based on the LSB (i.e., '0' and '1') when a LSB program is performed. Thus, when a LSB program is performed, the LSB data information for one word line may be required. However, since the method of FIG. 7 needs to distinguish the first MLC from the second MLC when a LSB program is performed, the MSB data information for one word line are also required when a LSB program is performed. As described above, the third state may correspond to a data value "01", and the fourth state may correspond to a data value "11". In this case, the LSB of the first MLC is '1', and the LSB of the second MLC is '1'. In addition, the MSB of the first MLC is '0', and the MSB of the second MLC is '1'. Further, the first state may correspond to a data value "00", and the second state may correspond to a data value "10". In this case, the LSB of the third MLC is '0'. Hence, in these s (S440, S445), the first MLC, the second MLC, and the third MLC may be distinguished from each other based on the LSB (i.e., '0' and '1') and the MSB (i.e., '0' and '1').

Meanwhile, the first shadow state may have a lower verification voltage than the third state, and may have a higher verification voltage than the second state. In addition, the second shadow state may have a lower verification voltage than the fourth state, and may have a higher verification voltage than the third state. That is, the first shadow state may be placed between the second state and the third state, and the second shadow state may be placed between the third state and the fourth state. The method of FIG. 7 may not directly program the first MLC and the second MLC to have their final states (i.e., the third state and the fourth state), respectively. As described above, the method of FIG. 7 may main-program the first MLC to have a final state (i.e., the third state), and may main-program the second MLC to have a final state (i.e., the fourth state) after shadow-programming the first MLC to have the first shadow state and shadow-programming the second MLC to have the second shadow state. In one example embodiment, the first MLC coupled to one word line may be shadow-programmed to have the first shadow state, and the second MLC coupled to one word line may be shadow-programmed to have the second shadow state after a MSB program is performed on a previous word line that is not adjacent to the word line. In another example embodiment, after the first MLC coupled to one word line are shadow-programmed to have the first shadow state, and the second MLC coupled to one word line may be shadow-programmed to have the second shadow state, a MSB program may be performed on a previous word line that is not adjacent to the word line.

The method of FIG. 7 may shadow-program the third MLC to have the third shadow state based on the MSB data information (S460). As described above, a final state of the third MLC is the second state. Generally, a plurality of MLC coupled to one word line may be divided based on the MSB (i.e., '0' and '1') when a MSB program is performed. Thus, when a MSB program is performed, the MSB data information for one word line may be required. However, since the method of FIG. 7 needs to shadow-program the third MLC to have the third shadow state, the MSB data information for one word line are required in this (S460). Meanwhile, the second shadow state may have a lower verification voltage than the second state. In addition, the third shadow state may have a higher verification voltage than the first state (i.e., an erase state), and may have a lower verification voltage that the second state. That is, the third shadow state may be placed between the first state and the second state. The method of FIG. 7 may not directly program the third MLC to have a final state (i.e., the second state). As described above, the method of FIG. 7 may main-program the third MLC to have a final state (i.e., the second state) after shadow-programming the third MLC to have the third shadow state.

Next, when a MSB program is performed, the method of FIG. 7 may main-program the first MLC having the first shadow state to have a final state (i.e., the third state) based on the MSB data information (S480), may main-program the second MLC having the second shadow state to have a final state (i.e., the fourth state) based on the MSB data information (S485), and may main-program the third MLC having the third shadow state to have a final state (i.e., the second state) based on the MSB data information (S490). In one example embodiment, the method of FIG. 7 may main-program the first MLC having the first shadow state to have a final state (i.e., the third state) (S480), may main-program the second MLC having the second shadow state to have a final state (i.e., the fourth state) (S485), and then may main-program the third MLC having the third shadow state to have a final state (i.e., the second state) (S490). In another example embodiment, the method of FIG. 7 may main-program the first MLC having the first shadow state to have a final state (i.e., the third state) (S480), and may main-program the second MLC having the second shadow state to have a final state (i.e., the fourth state) (S485) after main-programming the third MLC having the third shadow state to have a final state (i.e., the second state) (S490). According to some example embodiments, the method of FIG. 7 may simultaneously perform these (S480, S485, S490).

As described above, when performing a LSB program and a MSB program on a plurality of MLC, the method of FIG. 7 may main-program the MLC to a final state after shadow-programming the MLC to a shadow state based on the MSB data information and LSB data information. Hence, aggressor/victim coupling (e.g., bit-line coupling and word line coupling) between adjacent MLC may be reduced or prevented. Hereinafter, the method of FIG. 7 will be described in some additional detail with reference to FIGS. 8A through 8E.

FIG. 8, inclusive of FIGS. 8A through 8E, further illustrates the method of FIG. 7.

Referring to FIGS. 8A through 8E, by the method of FIG. 7, a plurality of MLC coupled to a current word line are programmed, respectively to have one state of a first state P1, a second state P2, a third state P3, and a fourth state P4. The first state P1, the second state P2, the third state P3, and the fourth state P4 may correspond to a data value "00", a data value "10", a data value "01", and a data value "11", respectively. Here, the first through fourth states P1 through P4 indicates a threshold voltage distribution of the MLC. In addition, the first through fourth states P1 through P4 may be verified by respective verification voltages.

Figure 8A:
FIGS. 8A through 8E are diagrams illustrating a method of FIG. 7.

FIG. 8A shows that a plurality of MLC coupled to a word line have the first state P1 (i.e., an erase state).

Figure 8B:
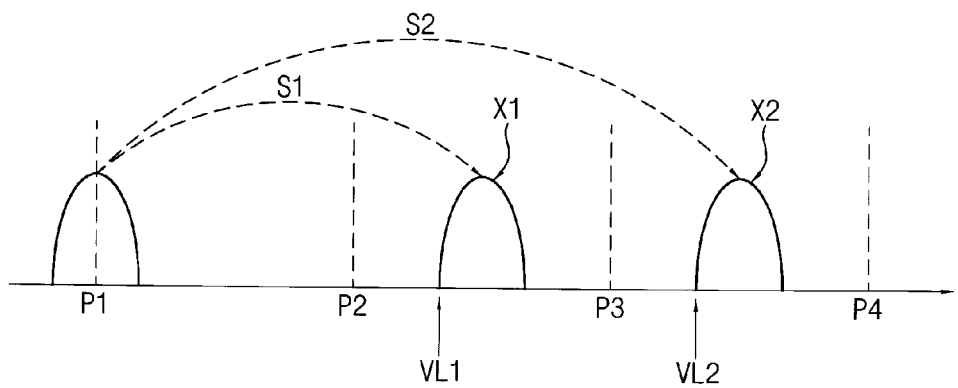

FIG. 8B shows that first MLC of which a final state is the third state P3 are shadow-programmed (i.e., indicated by arrow S1) to a first shadow state X1, and second MLC of which a final state is the fourth state P4 are shadow-programmed (i.e., indicated by arrow S2) to a second shadow state X2 based on the LSB data information and the MSB data information during LSB programming. As illustrated in FIG. 8B, the first shadow state X1 may be placed between the second state P2 and the third state P3, and each first multi-level cell having the first shadow state X1 may have a threshold voltage higher than a first verification voltage VL1. In addition, the second shadow state X2 may be disposed between the third state P3 and the fourth state P4, and each second multi-level cell having the second shadow state X2 may have a threshold voltage higher than a second verification voltage VL2. In one example embodiment, the shadow-programs S1 and S2 may be performed using an ISPP technique. In another example embodiment, the shadow-programs S1 and S2 may be performed using one shot pulse program technique. As described above, it is preferable that the method of FIG. 7 uses the ISPP technique rather than the one shot pulse program technique when performing the shadow-programs S1 and S2 because the ISPP technique can further narrow a threshold voltage distribution compared to the one shot pulse program technique. Thus, the method of FIG. 7 may program the first MLC by applying a program voltage to the first MLC, the program voltage being increased as a program operation is repeated, may verify states (i.e., program states) of the first MLC by comparing threshold voltages of the first MLC with the first verification voltage VL1, and may repeat a programming operation by applying the program voltage increased by a predetermined for the first MLC of which threshold voltages are lower than the first verification voltage VL1. Here, a programming operation may be finished for the first MLC of which threshold voltages are higher than the first verification voltage VL1. Similarly, the method of FIG. 7 may program the second MLC by applying a program voltage to the second MLC, the program voltage being increased as a program operation is repeated, may verify states (i.e., program states) of the second MLC by comparing threshold voltages of the second MLC with the second verification voltage VL2, and may repeat a programming operation by applying the program voltage increased by a predetermined for the second MLC of which threshold voltages are lower than the second verification voltage VL2. Here, a programming operation may be finished for the second MLC of which threshold voltages are higher than the second verification voltage VL2.

Figure 8C:
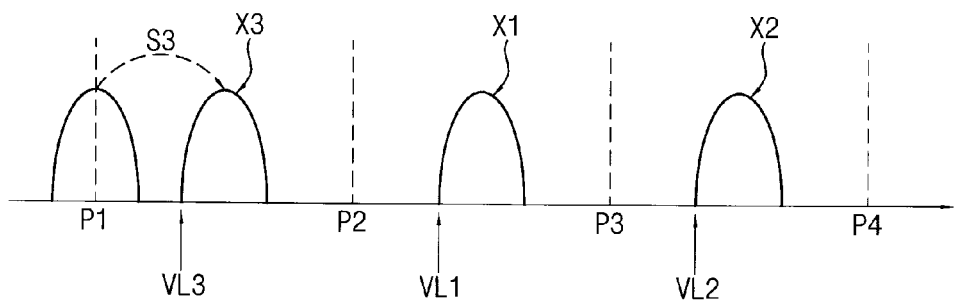

FIG. 8C shows that third MLC of which a final state is the second state P2, are shadow-programmed (i.e., indicated by arrow S3) to have a third shadow state X3 based on the MSB data information. As illustrated in FIG. 8C, the third shadow state X3 may be placed between the first state P1 and the second state P2, and each third multi-level cell having the third shadow state X3 may have a threshold voltage higher than a third verification voltage VL3. Here, the third verification voltage VL3 is lower than the first verification voltage VL1. In one example embodiment, the shadow-program S3 may be performed using the ISPP technique. In another example embodiment, the shadow-program S3 may be performed using the one shot pulse program technique. As described above, the method of FIG. 7 may program the third MLC by applying a program voltage to the third MLC, the program voltage being increased as a programming operation is repeated, may verify states (i.e., program states) of the third MLC by comparing threshold voltages of the third MLC with the third verification voltage VL3, and may repeat a programming operation by applying the program voltage increased by a predetermined for the third MLC of which threshold voltages are lower than the third verification voltage VL3. Here, a programming operation may be finished for the third MLC of which threshold voltages are higher than the third verification voltage VL3.

Figure 8D:
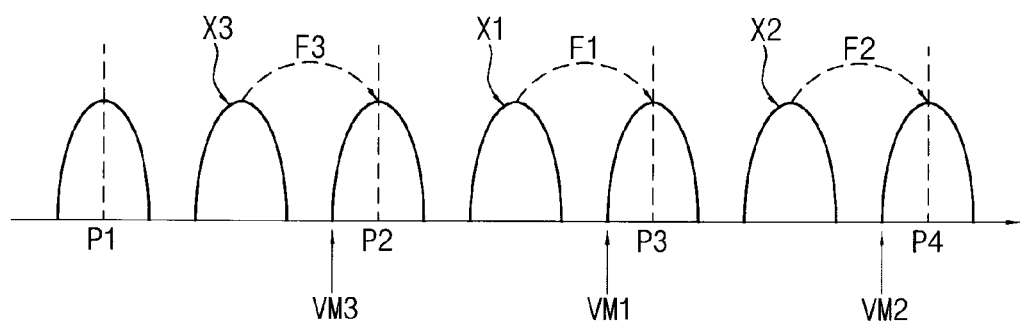

FIG. 8D shows that the first MLC having the first shadow state X1 are main-programmed (i.e., indicated by arrowF1) to have a final state (i.e., the third state P3), the second MLC having the second shadow state X2 are main-programmed (i.e., indicated by arrowF2) to have a final state (i.e., the fourth state P4), and the third MLC having the third shadow state X3 are main-programmed (i.e., indicated by arrowF3) to have a final state (i.e., the second state P2) based on the MSB data information when a MSB program is performed. In one example embodiment, the method of FIG. 7 may main-program the first MLC having the first shadow state X1 to have a final state (i.e., the third state P3), may main-program the second MLC having the second shadow state X2 to have a final state (i.e., the fourth state P4), and then may main-program the third MLC having the third shadow state X3 to have a final state (i.e., the second state P2). In another example embodiment, the method of FIG. 7 may main-program the first MLC having the first shadow state X1 to have a final state (i.e., the third state P3), and may main-program the second MLC having the second shadow state X2 to have a final state (i.e., the fourth state P4) after main-programming the third MLC having the third shadow state X3 to have a final state (i.e., the second state P2). According to some example embodiments, the method of FIG. 7 may simultaneously perform the main-programs F1 and F2. In one example embodiment, the main-programs F1, F2, and F3 may be performed using the ISPP technique. In another example embodiment, the main-programs F1, F2, and F3 may be performed using the one shot pulse program technique. As described above, it is preferable that the method of FIG. 7 uses the ISPP technique rather than the one shot pulse program technique when performing the main-programs F1, F2, and F3 because the ISPP technique can further narrow a threshold voltage distribution compared to the one shot pulse program technique.

In detail, the method of FIG. 7 may program the first MLC of which a final state is the third state P3 by applying a program voltage every program loop, may verify states (i.e., program states) by comparing threshold voltages of the first MLC with a first final verification voltage VM1, and then may repeat a programming operation by applying the program voltage increased by a predetermined for the first MLC of which threshold voltages are lower than the first final verification voltage VM1. Here, a programming operation may be finished for the first MLC of which threshold voltages are higher than the first final verification voltage VM1. In addition, the method of FIG. 7 may program the second MLC of which a final state is the fourth state P4 by applying a program voltage every program loop, may verify states (i.e., program states) by comparing threshold voltages of the second MLC with a second final verification voltage VM2, and then may repeat a programming operation by applying the program voltage increased by a predetermined for the second MLC of which threshold voltages are lower than the second final verification voltage VM2. Here, a programming operation may be finished for the second MLC of which threshold voltages are higher than the second final verification voltage VM2. Further, the method of FIG. 7 may program the third MLC of which a final state is the second state P2 by applying a program voltage every program loop, may verify states (i.e., program states) by comparing threshold voltages of the third MLC with a third final verification voltage VM3, and then may repeat a programming operation by applying the program voltage increased by a predetermined for the third MLC of which threshold voltages are lower than the third final verification voltage VM3. Here, a programming operation may be finished for the third MLC of which threshold voltages are higher than the third final verification voltage VM3.

Figure 8E:
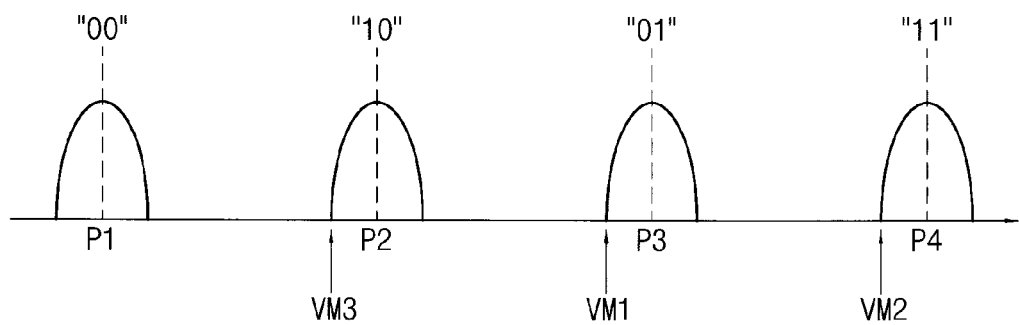

FIG. 8E shows that a plurality of MLC coupled to one word line are finally programmed by the method of FIG. 7. That is, each multi-level cell coupled to one word line may be programmed to have one state of the first state P1, the second state P2, the third state P3, and the fourth state P4. As illustrated in FIG. 8E, each multi-level cell having the third state P3 may have a threshold voltage higher than the first final verification voltage VM1, each multi-level cell having the fourth state P4 may have a threshold voltage higher than the second final verification voltage VM2, and each multi-level cell having the second state P2 may have a threshold voltage higher than the third final verification voltage VM3. Thus, a non-volatile memory device (e.g., a NAND flash memory device) may detect MLC corresponding to a data value "00" by reading the first state P1 (i.e., an erase state), may detect MLC corresponding to a data value "10" by reading the second state P2, may detect MLC corresponding to a data value "01" by reading the third state P3, and may detect MLC corresponding to a data value "11" by reading the fourth state P4. Hence, the method of FIG. 7 may efficiently reduce a coupling (e.g., a bit-line coupling and a word line coupling) caused between adjacent MLC when a LSB program and a MSB program are performed on a plurality of MLC by main-programming (i.e., indicated as arrows F1, F2, and F3) the MLC having a shadow state to have a final state (i.e., the second state P2, the third state P3, the fourth state P4) after shadow-programming (i.e., indicated as arrows S1, S2, and S3) the MLC to have a shadow state based on the LSB data information and the MSB data information.

Figure 9:
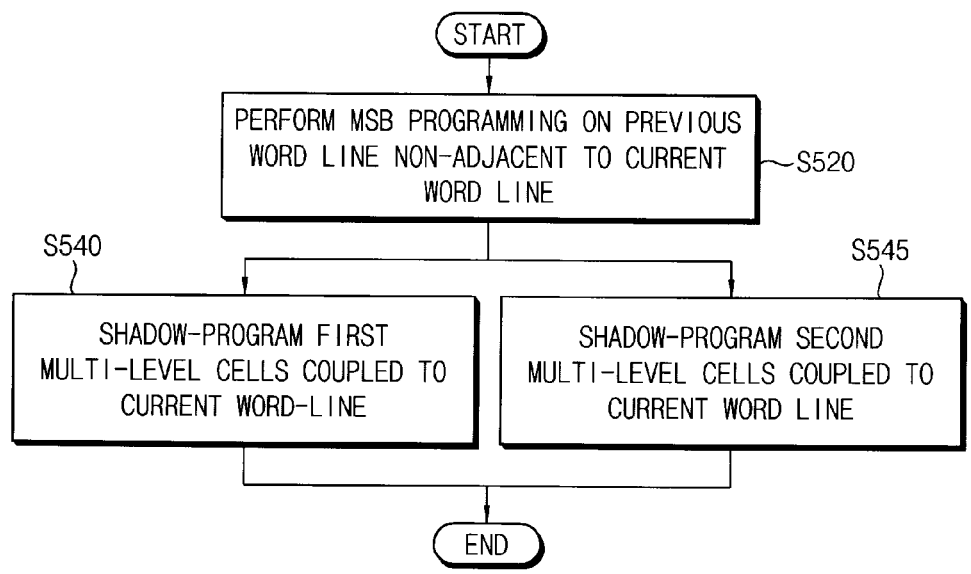
FIG. 9 is a flow chart illustrating an example in which multi-level cells are programmed by a method of FIG. 7.
Figure 10:
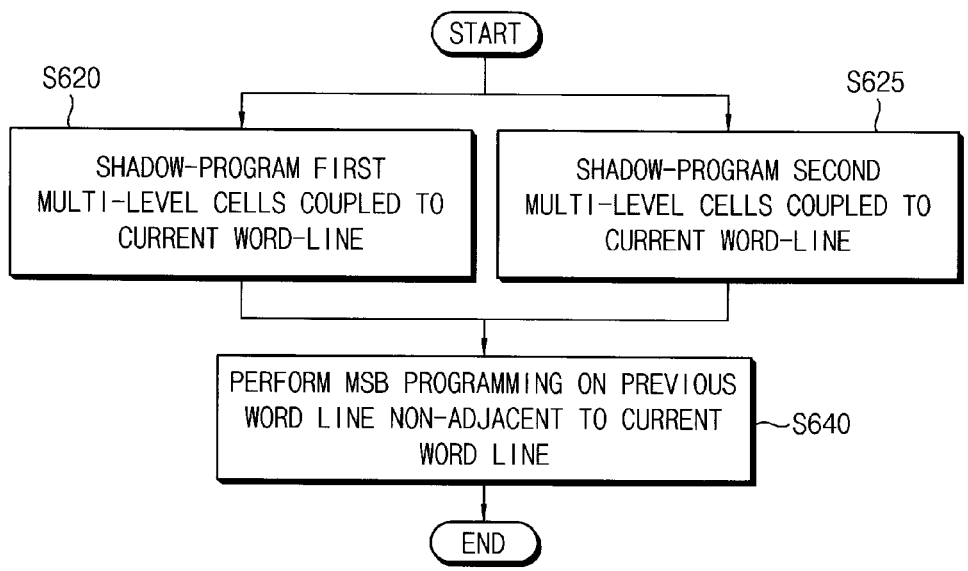
FIG. 10 is a flow chart illustrating another example in which multi-level cells are programmed by a method of FIG. 7.

FIGS. 9 and 10 are flow charts respectively illustrating examples in which MLC are programmed using the method of FIG. 7.

Referring to FIGS. 9 and 10, the method of FIG. 7 may shadow-program first MLC coupled to a word line (S540), a final state of the first MLC being the third state P3, and may shadow-program second MLC coupled to the word line (S545), a final state of the second MLC being the fourth state P4, after performing a MSB program on a previous word line that is not adjacent to the word line (S520). Alternatively, the method of FIG. 7 may shadow-program first MLC coupled to one word line (S620), a final state of the first MLC being the third state P3, and may shadow-program second MLC coupled to the word line (S625), a final state of the second MLC being the fourth state P4, before performing a MSB program on a previous word line that is not adjacent to the word line (S640). However, since it is illustrated referring to FIGS. 3 and 5, duplicated descriptions will be omitted below. As described above, the method of FIG. 7 may efficiently prevent a word line coupling caused in a word line direction among the word lines by separating a MSB program on one word line from a LSB program on another word line that is adjacent to the word line.

Figure 11:
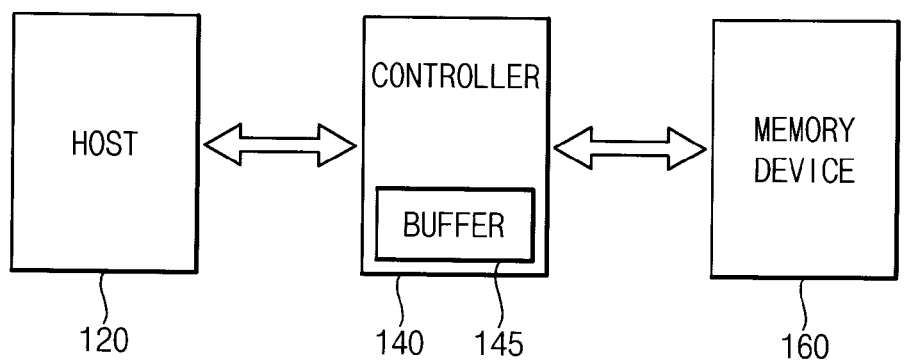
FIG. 11 is a block diagram illustrating an example of a memory system employing a method of programming a plurality of multi-level cells for a non-volatile memory device according to example embodiments.

FIG. 11 is a block diagram illustrating a memory system that may employ a method of programming a plurality of MLC for a non-volatile memory device according to an embodiment of the inventive concept.

Referring to FIG. 11, the memory system 100 may include a host 120, a controller 140, and a memory device 160. For example, the memory system 100 may be a memory card such as a multimedia card (MMC), an embedded multimedia card (eMMC), a hybrid embedded multimedia card (hybrid eMMC), a secure digital card (SD card), a micro SD card, a memory stick, an ID card, a personal computer memory card international association card (PCMCIA card), a chip card, a USB card, a smart card, a compact flash card (CF card), etc.

The host 120 may provide data to be stored in the memory device 160, and may receive data that is stored in the memory device 160. The memory device 160 may be a non-volatile memory device (e.g., a NAND flash memory device). In this case, the memory device 160 may include a memory cell array, a row decoder, a page buffer, a pass-fail detector, a program controller, and a voltage generator. According to some example embodiments, a plurality of MLC included in the memory cell array may have one structure among various cell structures including a charge storing layer (e.g., a charge trapping layer). The structure may correspond to a charge trapping flash structure, a stack flash structure, a fin-type flash structure, etc. The controller 140 may control the memory device 160, and may perform data communications between the host 120 and the memory device 160. In one example embodiment, the controller 140 may include a central processing unit (CPU), a host interface, and a memory interface. Here, the CPU may perform operations for data communications. The host interface may perform data communications using a standard protocol such as a universal serial bus (USB), a multi-media card (MMC), a peripheral component interconnect express (PCI-E), a serial-attached SCSI (SAS), a serial advanced technology attachment (SATA), a parallel advanced technology attachment (PATA), a small computer system interface (SCSI), an enhanced small disk interface (ESDI), an integrated drive electronics (IDE), etc. The memory interface may perform data communications with the memory device 160 using a standard protocol such as a NAND interface protocol, etc.

As illustrated in FIG. 11, the controller 140 may include a buffer 145. The buffer 145 may temporarily store data provided from the host 120 or data provided from the memory device 160. The buffer 145 may be implemented by a dynamic random access memory (DRAM), a static random access memory (SRAM), a phase random access memory (PRAM), a ferroelectric random access memory (FRAM), a resistive random access memory (RRAM), or a magnetic random access memory (MRAM). According to some example embodiments, the buffer 145 may be located outside the controller 140. In addition, the controller 140 may be built-in the memory device 160. In this case, a NAND flash memory device having a built-in controller may be referred to as One-NAND flash memory device. The memory system 100 may employ a method of programming MLC according to example embodiments. In one example embodiment, when a LSB program and a MSB program are performed on a plurality of MLC of the memory device 160, the memory system 100 may shadow-program first and second MLC to have a shadow state (i.e., a first shadow state and a second shadow state, respectively), and then may main-program the first and second MLC to have a final state (i.e., a third state or a fourth state, and a second state, respectively) based on information of MSB data and information of LSB data. Here, a final state of the first MLC may be the third state or the fourth state, and a final state of the second MLC may be the second state. In another example embodiment, when a LSB program and a MSB program are performed on a plurality of MLC of the memory device 160, the memory system 100 may shadow-program first through third MLC to have a shadow state (i.e., a first shadow state, a second shadow state, and a third shadow state, respectively), and then may main-program the first through third MLC to have a final state (i.e., a third state, a fourth state, and a second state, respectively) based on information of MSB data and information of LSB data.

In case that the controller 140 includes the buffer 145, the controller 140 may temporarily store the MSB data provided from the host 120, and may provide the MSB data to the memory device 160 when a method of programming MLC according to example embodiments is performed. As described above, a method of programming MLC according to example embodiments may shadow-program a plurality of MLC coupled to one word line to have a shadow state based on the MSB data information and the LSB data information before a MSB program is performed on the word line. Here, since the MSB data needs to be input prior to performing a MSB program on the word line, the controller 140 may temporarily store the MSB data for the word line using the buffer 145, and may provide the MSB data to the memory device 160 when a MSB program is performed on the word line. In other words, since the controller 140 receives the MSB data for one word line from the host 120, the controller 140 may not receive the MSB data for the word line from the host 120 again when a MSB program is performed on the word line. As a result, the memory system 100 may improve operating speed and reduce power consumption.

The memory system 100 may correspond to a memory card, a solid state driver, etc. Here, the memory system 100 may be implemented by various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat-Pack (TQFP), Small Outline Integrated Circuit (SOIC), Shrink Small Outline Package (SSOP), Thin Small Outline Package (TSOP), Thin Quad Flat-Pack (TQFP), System In Package (SIP), Multi Chip Package (MCP), Wafer-level Fabricated Package (WFP), Wafer-Level Processed Stack Package (WSP). In addition, the memory system 100 may be coupled to the host 120 such as a computer, a laptop, a cellular phone, a smart phone, a MP3 player, a personal digital assistants (PDA), a portable multimedia player (PMP), a digital TV, a digital camera, a portable game console, etc.

Figure 12:
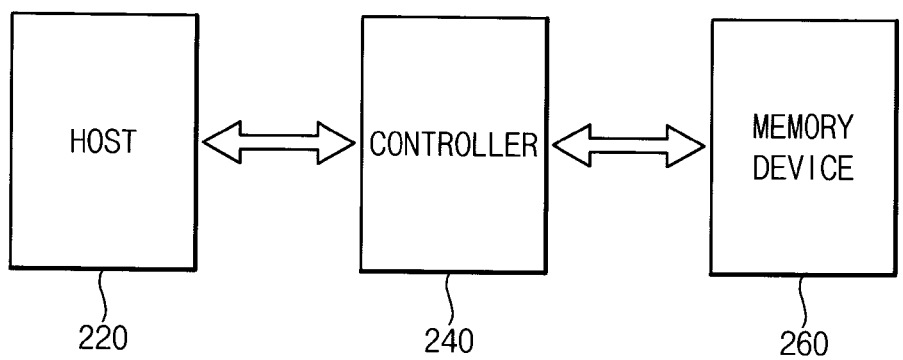
FIG. 12 is a block diagram illustrating another example of a memory system employing a method of programming a plurality of multi-level cells for a non-volatile memory device according to example embodiments.

FIG. 12 is a block diagram illustrating another example of a memory system employing a method of programming a plurality of MLC for a non-volatile memory device according to an embodiment of the inventive concept.

Referring to FIG. 12, the memory system 200 may include a host 220, a controller 240, and a memory device 260. For example, the memory system 200 may be a memory card such as a MMC, an eMMC, a hybrid eMMC, a SD card, a micro SD card, a memory stick, an ID card, a PCMCIA card, a chip card, a USB card, a smart card, a CF card, etc. Except that the memory system 200 of FIG. 12 does not include the buffer of the controller that temporarily stores a MSB data for one word line input from the host, and then provides the MSB data for the word line to the memory device when a MSB program is performed on the word line, the memory system 200 of FIG. 12 is substantially the same as the memory system 100 of FIG. 11. Thus, duplicated descriptions will be omitted below.

As described above, the memory system 200 may employ a method of programming MLC according to example embodiments. In one example embodiment, when a LSB program and a MSB program are performed on a plurality of MLC of the memory device 260, the memory system 200 may shadow-program first and second MLC to have a shadow state (i.e., a first shadow state, and a second shadow state, respectively), and then may main-program the first and second MLC to have a final state (i.e., a third state or a fourth state, and a second state, respectively) based on information of MSB data and information of LSB data. Here, a final state of the first MLC may be the third state or the fourth state, and a final state of the second MLC may be the second state. In another example embodiment, when a LSB program and a MSB program are performed on a plurality of MLC of the memory device 260, the memory system 200 may shadow-program first through third MLC to have a shadow state (i.e., a first shadow state, a second shadow state, and a third shadow state, respectively), and then may main-program the first through third MLC to have a final state (i.e., a third state, a fourth state, and a second state, respectively) based on information of MSB data and information of LSB data. Here, a final state of the first MLC may be the third state, a final state of the second MLC may be the fourth state, and a final state of the third MLC may be the second state. Meanwhile, since the controller 240 may not include the buffer 145 illustrated in FIG. 11, the controller 240 may receive the MSB data for one word line from the host 220 for the shadow-programming operation, and then may receive the MSB data for the word line from the host 220 again for the main-programming operation when a MSB program is performed on the word line. As a result, operation speed and power consumption of the memory system 200 may be increased. However, the memory system 200 may achieve high operational reliability because the MSB data are not lost even when buffer malfunction or sudden power-off is caused.

Figure 13:
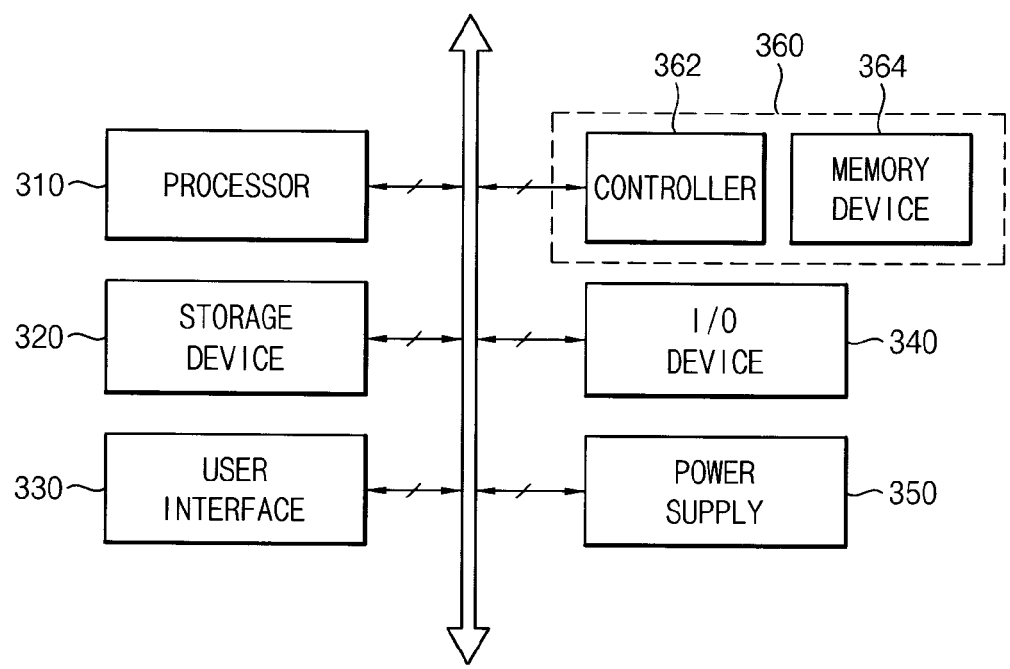
FIG. 13 is a block diagram illustrating an example of a computational system having a memory system employing a method of programming a plurality of multi-level cells for a non-volatile memory device according to example embodiments.

FIG. 13 is a block diagram illustrating an example of a computational system having a memory system employing a method of programming a plurality of MLC for a non-volatile memory device according to an embodiment of the inventive concept.

Referring to FIG. 13, the computational system 300 may include a processor 310, a storage device 320, a user interface 330, an input/output (I/O) device 340, a power supply 350, and a memory system 360. Here, the memory system 360 may correspond to the memory system 100 of FIG. 11 or the memory system 200 of FIG. 12. Although not illustrated in FIG. 13, the computational system 300 may further include a plurality of ports for communicating a video card, a sound card, a memory card, a universal serial bus (USB) device, other electric devices, etc.

The processor 310 may perform various computing functions. The processor 310 may be a micro-processor, a central processing unit (CPU), etc. The processor 310 may be coupled to other components via an address bus, a control bus, a data bus, etc. According to some example embodiments, the processor 310 may be coupled to an extended bus such as a peripheral component interconnection (PCI) bus. The storage device 320 may be a solid state drive device, a hard disk drive device, a CD-ROM device, etc. The user interface 330 may provide ease of use for users. The I/O device 340 may include an input device such as a keyboard, a keypad, a mouse, etc., and an output device such as a printer, a display device, etc. The power supply 350 may provide a power for operations of the computational system 300. The memory system 360 may store data for operations of the computational system 300. For example, the memory system 360 may include a controller 362 and a memory device 364 such as a NAND flash memory device. For example, the memory system 360 may further include a volatile memory device such as a dynamic random access memory (DRAM) device, a static random access memory (SRAM) device, a mobile DRAM, etc, and a non-volatile memory device such as an erasable programmable read-only memory (EPROM) device, an electrically erasable programmable read-only memory (EEPROM) device, etc. According to some example embodiments, the computational system 300 may further include an application chipset, a camera image processor (CIS), etc.

As described above, the memory system 360 employs a method of programming MLC according to example embodiments. In one example embodiment, when a LSB program and a MSB program are performed on a plurality of MLC of the memory device, the memory system 360 may shadow-program first and second MLC to have a shadow state (i.e., a first shadow state, and a second shadow state, respectively), and then may main-program the first and second MLC to have a final state (i.e., a third state or a fourth state, and a second state, respectively) based on information of MSB data and information of LSB data. Here, a final state of the first MLC may be the third state or the fourth state, and a final state of the second MLC may be the second state. In another example embodiment, when a LSB program and a MSB program are performed on a plurality of MLC of the memory device, the memory system 360 may shadow-program first through third MLC to have a shadow state (i.e., a first shadow state, a second shadow state, and a third shadow state, respectively), and then may main-program the first through third MLC to have a final state (i.e., a third state, a fourth state, and a second state, respectively) based on information of MSB data and information of LSB data. Here, a final state of the first MLC may be the third state, a final state of the second MLC may be the fourth state, and a final state of the third MLC may be the second state. As a result, the memory system 360 may reduce a coupling (e.g., a bit-line coupling and a word line coupling) caused between adjacent MLC in the memory device 364. Further, the memory system 360 may achieve high operational reliability by reducing data lost due to the coupling. Although it is described above that the present inventive concept is applied to a NAND flash memory device, the present invention is not limited thereto.

Certain embodiments of the inventive concept have been set forth in the context of various non-volatile memory devices (e.g., a NAND flash memory devices) incorporating a plurality of MLC, and various systems including such non-volatile memory devices. For example, the present inventive concept may be applied to a computer, a laptop, a memory card, a solid state drive (SSD), a cellular phone, a smart phone, a smart pad, a PDA, a PMP, a MP3 player, a digital TV, a digital camera, a portable game console, etc. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming multi-level cells (MLC) in a non-volatile memory device, the programming method including least significant bit (LSB) programming followed by most significant bit (MSB) programming, wherein each MLC is capable of being programmed to one of a first state defined by a first threshold voltage distribution, a second state defined by a second threshold voltage distribution greater than the first threshold voltage distribution, third state defined by a third threshold voltage distribution greater than the second threshold voltage distribution, and a fourth state defined by a fourth threshold voltage distribution greater than the third threshold voltage distribution, the method comprising:
    receiving MSB data information and LSB data information for a plurality of MLC coupled to a current word line within the non-volatile memory;
    shadow-programming first MLC among the plurality of MLC to a first shadow state based on the LSB data information during LSB programming, wherein a final state following programming for each one of the first MLC is the third state or the fourth state;
    shadow-programming second MLC among the plurality of MLC to a second shadow state based on the MSB data information, wherein a final state following programming for each one of the second MLC is the second state; and then,
    main-programming the first MLC from the first shadow state to either the third state or the fourth state and main-programming the second MLC from the second shadow state to the second state during MSB programming.

2. The method of claim 1, wherein the non-volatile memory device is a NAND flash memory device and at least one of the LSB programming and MSB programming is performed using an incremental step pulse program (ISPP) technique.

3. The method of claim 1, wherein a first state corresponds to a data value "00", the second state corresponds to a data value "10", the third state corresponds to a data value "01", and the fourth state corresponds to a data value "11".

4. The method of claim 3, wherein the first shadow state is defined by a first shadow threshold voltage distribution between the second threshold voltage distribution and the third threshold voltage distribution, and
    the second shadow state is defined by a second shadow threshold voltage distribution between the first threshold voltage distribution and the second threshold voltage distribution.

5. The method of claim 4, wherein the second MLC are main-programmed to the second state after the first MLC are main-programmed to either the third state or the fourth state.

6. The method of claim 4, wherein the first MLC are main-programmed to either the third state or the fourth state after the second MLC are main-programmed to the second state.

7. The method of claim 4, wherein the first MLC are shadow-programmed to the first shadow state after MSB programming of MLC coupled to a previous word line within the non-volatile memory non-adjacent to the current word line.

8. The method of claim 4, wherein MSB programming for a previous word line non-adjacent to the current word line is performed after the first MLC are shadow-programmed to the first shadow state.

9. A method of programming multi-level cells (MLC) in a non-volatile memory device, the programming method including least significant bit (LSB) programming followed by most significant bit (MSB) programing, wherein each MLC is capable of being programmed to one of a first state defined by a first threshold voltage distribution, a second state defined by a second threshold voltage distribution greater than the first threshold voltage distribution, third state defined by a third threshold voltage distribution greater than the second threshold voltage distribution, and a fourth state defined by a fourth threshold voltage distribution greater than the third threshold voltage distribution, the method comprising:

receiving MSB data information and LSB data information for a plurality of MLC coupled to a current word line in the non-volatile memory;

during LSB programming and based on the LSB data information and MSB data information, shadow-programming first MLC among the plurality of MLC to a first shadow state, wherein a final state following programming for each one of the first MLC is the third state, and shadow-programming second MLC among the plurality of MLC to a second shadow state second, wherein a final state following programming for each of the second MLC is the fourth state;

shadow-programming third MLC among the plurality of MLC to a third shadow state based on the MSB data information, wherein a final state following programming for each of the third MLC is the second state; and main-programming the first MLC from the first shadow state to the third state, main-programming the second MLC from the second shadow state to the fourth state, and main-programming the third MLC from the third shadow state to the second state during the MSB programming.

10. The method of claim 9, wherein a first state corresponds to a data value "00", the second state corresponds to a data value "10", the third state corresponds to a data value "01", and the fourth state corresponds to a data value "11".

11. The method of claim 10, wherein the first shadow state is defined by a first shadow threshold voltage distribution between the second state and the third state, the second shadow state is defined by a second shadow threshold voltage distribution between the third state and the fourth state, and the third shadow state is defined by a third shadow threshold voltage distribution between the first state and the second state.

12. The method of claim 11, wherein the third MLC are main-programmed to the second state after the first MLC are main-programmed to the third state and after the second MLC are main-programmed to the fourth state.

13. The method of claim 11, wherein the first MLC are main-programmed to the third state and the second MLC are main-programmed to the fourth state after the third MLC are main-programmed to the second state.

14. The method of claim 11, wherein the first MLC are shadow-programmed to the first shadow state and the second MLC are shadow-programmed to the second shadow state after MSB programming is performed on a previous word line non-adjacent to the current word line.

15. The method of claim 11, wherein MSB programming is performed on a previous word line non-adjacent to the current word line after the first MLC are shadow-programmed to the first shadow state, and the second MLC are shadow-programmed to the second shadow state.

\* \* \* \* \*